SEMICONDUCTOR INTEGRATED CIRCUIT INCLUDING A BIDIRECTIONAL TRANSISTOR AND METHOD OF MAKING THE SAME

Filed June 15, 1967 2 Sheets-Sheet 1

WITNESSES

Theodore F. Wrobel

James F. Young

INVENTOR

Binne Van Der Leest

BY Gordon K. Telfer

ATTORNEY

United States Patent Office 3,483,446
Patented Dec. 9, 1969

3,483,446

SEMICONDUCTOR INTEGRATED CIRCUIT INCLUDING A BIDIRECTIONAL TRANSISTOR AND METHOD OF MAKING THE SAME

Binne van der Leest, Linthicum Heights, Md., assignor to Westinghouse Electric Corporation, Pittsburgh, Pa., a corporation of Pennsylvania Filed June 15, 1967, Ser. No. 646,317
Int. Cl. H01l 11/00, 15/00
U.S. Cl. 317—235 8 Claims

ABSTRACT OF THE DISCLOSURE

A method of forming an integrated transistor having good bidirectional characteristics is described including simultaneously driving in impurities to form an isolation wall and also a transistor base region, and also diffusing a low resistivity region within the base region, and of the same conductivity type, in a pattern surrounding the emitter region. The device is characterized by a deep collector junction and a deep emitter junction having good reverse breakdown characteristics. The emitter-collector reverse breakdown voltage is improved by the low resistivity ring in the base region.

BACKGROUND OF THE INVENTION

Field of the invention

The invention is applicable to semiconductor integrated circuits, particularly those requiring bidirectional transistors whose characteristitcs include high current gain, low saturation resistance, low offset voltage, and high breakdown voltage regardless of the direction in which the device is operated. Such elements are required in circuits that handle relatively large AC signals such as analog switching circuits

Description of the prior art

In discrete transistors it is relatively easy to design for good bidirectional characteristics. In semiconductor integrated circuits, circuits requiring good bidirectional transistors have previously been generally avoided but where such elements have been integrated there has been difficulty in doing so without departure from existing fabrication processes or without accepting a relatively low level of bidirectional performance.

Objects of this invention include the provision of bidirectional transistors in integrated circuits with good characteristics by fabrication techniques thoroughly compatible with those presently employed in integrated circuit fabrication.

SUMMARY OF THE INVENTION

In accordance with this invention semiconductor integrated circuits are fabricated by first forming a substrate, floating collector, and epitaxial layer configuration, that may be similar to that previously used although the epitaxial layer is preferably relatively thick (i.e., greater than 12 microns). Quantities of doping material are selectively deposited on the surface of the epitaxial layer in configurations desired for the base region of the bidirectional transistor and also for the isolation wall. The quantity of doping impurity for the base region has a lower impurity concentration than for the isolation wall. Upon heating the impurities are simultaneously driven into the layer to the extent that a base region is formed terminating with a material of the layer and an isolation wall which extends through the layer to the substrate. The emitter region is diffused within the base region and a low resistivity ring is diffused within the base region surrounding the emitter.

The structure formed in the practice of this invention is characterized by the base region having a relatively great depth within the epitaxial layer, greater than half the distance through the epitaxial layer. The emitter region is also diffused relatively deeply within the base region to provide a desirable spacing less than 3 micron, between the emitter and collector junctions. The emitter junction is therefore relatively large and in relatively low doped material of the base region. The low resistivity ring in the base region is also significant in improving the reverse characteristics of the bidirectional structure which are evidenced by operation with the region nominally designating the collector, that is the portion of the epitaxial layer underlying the selectively diffused base and emitter regions, is operated, at least during a principal part of its operating circuit, as a forward biased junction emitting carriers into the base region and the region nominally designated as the emitter region is operated over a principal part of the operating cycle in the reverse direction.

Description of the preferred embodiments

Figure 1:
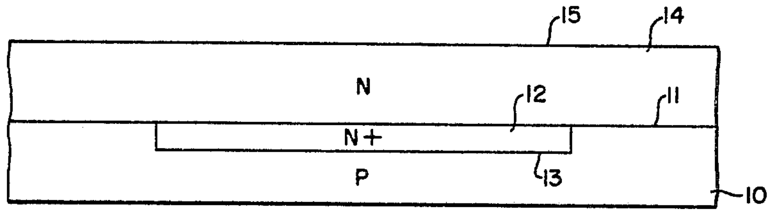
FIGURES 1 through 5 are partial cross sectional views of a semiconductor integrated circuit in accordance with this invention at successive stages in the fabrication process.

Referring to the drawing, FIG. 1 shows a substrate 10 of a semiconductive material such as silicon that is doped to be of p type conductivity in this example. The substrate 10 has a substantially planar surface 11 in which an opposite conductivity type region 12 is disposed forming a junction 13. The region 12 is relatively highly doped and is designated as of n+ type material. Over the surface 11 and covering the region 12 is an n type epitaxial layer 14. The epitaxial layer 14 has a substantially planar surface 15 remote from the substrate 10 on which subsequent diffusion operations are performed to complete the integrated circuit structure.

The substrate 10 is of single crystal material formed by conventional techniques and may, for example, be boron doped to have a resistivity of from about 10 ohm-centimeters to about 40 ohm-centimeters or more. The surface 11 of the substrate 10 may be near <111> orientation in order to facilitate the growth of epitaxial layer 14 thereon.

The n+ region 12 is referred to as a floating collector region. The floating collector region may be formed by conventional selective diffusion employing oxide masking. For example the surface 11 may be thermally oxidized to provide a layer of silicon dioxide having a thickness of about 12,000 angstroms and a window opened through the oxide layer, to provide an opening for the introduction of the doping impurity, by photolithographic techniques. The diffusion may be carried out with an arsenic impurity source to provide a region having a sheet resistivity of about 20 ohms per square and a junction depth of about 7 microns. Following the diffusion of the collector region 12 the oxide mask is removed. It is also possible to provide the floating collector region by forming an n+ layer over the entire surface 11, as by epitaxial growth or diffusion. The region 12 is then defined as a result of the subsequently formed isolation wall.

Epitaxial layer 14 is formed by an epitaxial growth process such as the thermal decomposition of silicon tetrachloride with hydrogen to provide what is in integrated circuit fabrication a relatively thick layer. The layer 14 suitably has a thickness of at least about 12 microns and is preferably of about 14 to 18 microns thickness, such thickness being generally adequate to provide elements with good characteristics without unduly prolonging fabrication time. A donor dopant such as arsenic or phosphorus is included among the epitaxial reactants so that the layer 14 is of n type conductivity and has relatively high resistivity compared with conventional integrated circuit structures. The epitaxial layer may suitably have a resistivity of at least one ohm-centimeter, although it is preferred that the resistivity be within the range of from about 1.5 ohm-centimeters to about 2.5 ohm-centimeters, such resistivity being suitable for obtaining the desired diffusion profiles in subsequent operations without unduly increasing saturation resistance of transistor structures. During the growth of layer 14 some impurities from region 12 diffuse further into the substrate as well as into the grown layer 14 but in its essential aspects the configuration remains unchanged.

Figure 2:
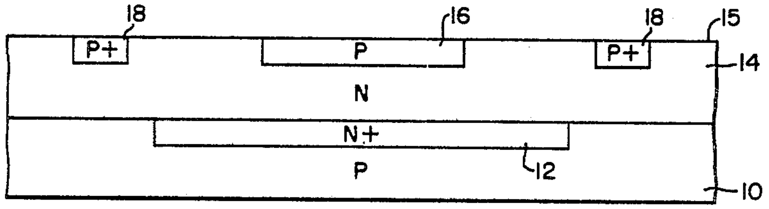

FIG. 2 shows the structure after first and second spaced quantities 16 and 18 of acceptor doping impurity has been selectively deposited on the surface 15 of layer 14. The first quantity of doping impurity 16 is disposed on surface 15 opposite region 12 and upon ultimate diffusion provides the transistor base region. The second quantity of doping impurity 18 is deposited in a pattern enclosing the first quantity 16. As a result of subsequent diffusion the second quantity 18 provides an isolation wall in the structure between the portions of the epitaxial layer 14.

To provide the impurity deposits 16 and 18 the surface 15 of the epitaxial layer 14 may be thermally oxidized to provide a layer of silicon dioxide having a thickness of about 8000 angstroms with windows formed in positions for transistor base depositions, and also for resistance regions and diode anode regions in other portions of the integrated circuit, by conventional photolithographic techniques. The deposition forms a shallow p type region whose depth may be about 2 microns. A suitable sheet resistivity is at least 100 ohms per square. A preferred range that provides good characteristics in the ultimate structure and does not unduly complicate the fabrication process, since reproducibility in performing very high resistivity depositions is difficult, is the range from about 160 ohms per square to about 220 ohms per square, the value selected depending upon the required reverse collector to emitter breakdown voltage.

Deposition 18 is made after remasking the surface although, if desired, some impurities could be deposited at the time of deposition 16. Deposition 18 is performed for a time sufficient to deposit on the surface 15 a concentration of doping impurities that upon subsequent redistribution, that is, heating in the absence of additionally supplied impurities, provide the desired diffusion profile. The diffusion processes employed may also in the case of the isolation wall diffusion involve continual supply of doping impurities until the diffused profile is achieved.

Figure 3:
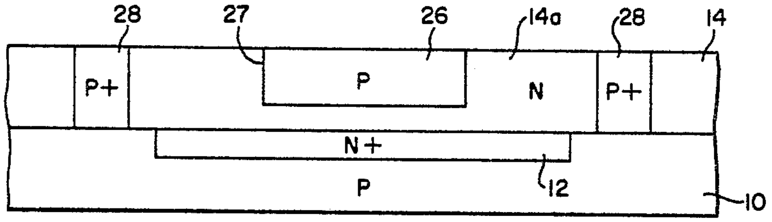

Upon heating to further diffuse the impurities in depositions 16 and 18 the structure appears as in FIG. 3. Impurities from the higher concentration of deposition 18 extend all the way through layer 14 to the substrate 10 to form isolation wall 28 defining and isolating collector region **14*a* within the epitaxial layer 14**. The isolation wall, as is usual, has a sheet resistivity of about 5 ohms per square. In this example the depth is about 16 microns due to the thickness of the epitaxial layer.

Impurities from deposition 16, being of lower concentration, form a region 26 defining a junction 27 within the epitaxial layer portion **14*a***. In accordance with this invention, this junction depth is greater than half the distance through the epitaxial layer such as about 9 to 11 microns for an epitaxial layer thickness of about 14 to 18 microns. This is an unusually deep base diffusion since typically base regions in integrated circuits are diffused only to a depth of about three or four microns. By way of further example, base regions to a depth of about 10 microns in epitaxial layers about 15 microns thick have been successfully formed and used.

Figure 4:
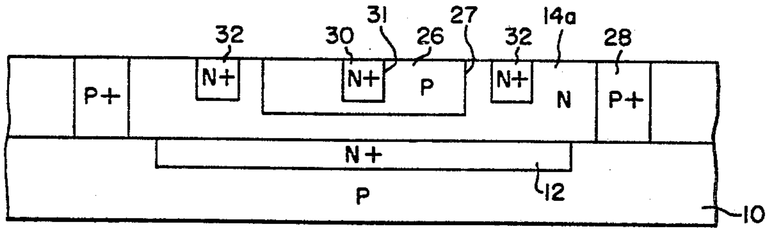

FIG. 4 shows the structure after an additional selective diffusion operation, such as by also using oxide masking, to form an n+ emitter region 30 within the base region 26 to define a junction 31 extending to within about three micron of the base-collector junction 27, or about 7 microns for a 10 micron deep base region. This depth is relatively great for transistor emitter regions in integrated circuits and results in the emitter junction 31 being at a portion of the base region having a relatively high resistivity and also results in a relatively larger area emitter junction.

Simultaneously with the formation of the emitter a collector contact region 32, that is, a region within the collector **14*a* having lower resistivity for ease in forming ohmic contacts, is formed in a ring confiuration around the base 26. The sheet resistivity of the regions 30 and 32** may be about 5 ohms per square.

Figure 5:
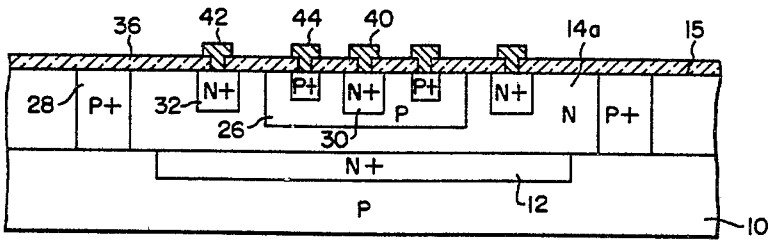

In FIG. 5 the structure is shown after an additional selective diffusion operation has been performed to form a region 34 of low resistivity material in the base 26 in a pattern completely surrounding the emitter 30. Region 34 is of the same conductivity type but has a sheet resistivity below about 10 ohms per square, such as about 5.5 ohms per square, and extends to a depth of about 2 microns.

FIG. 5 also illustrates the contact mask and final passivation layer 36, such as of silicon dioxide or glass, that covers the device surface 15 except where openings are provided for the disposition of ohmic contacts to certain ones of the regions. Contacts may be formed by depositing a continuous layer of metal, such as aluminum, over the surface of layer 36 and selectively removing it by photolithographic techniques and heating to bond such metal to the semiconductor material through the openings and elsewhere to the surface of layer 36. Contacts 40, 42 and 44 are illustrated on regions 30, 32 and 34, respectively. The low resistivity p+ region 34 is convenient for the application of the base ohmic contact but its main purposes, as described hereinafter, may be achieved even if the contact is disposed elsewhere on the base region.

Figure 6:
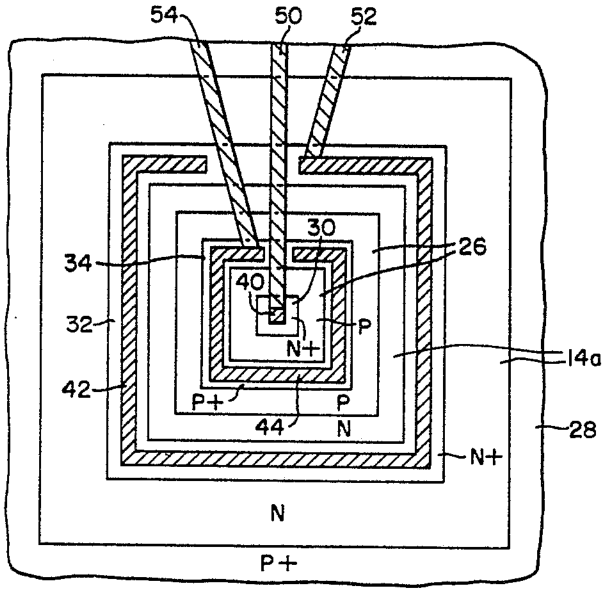
FIG. 6 is a partial plan view corresponding to the view of FIG. 5.

FIG. 6 illustrates a plan view of a structure like that of FIG. 5. The particular shape of the various regions may of course be varied from that shown. FIG. 6 also illustrates conductive interconnections 50, 52 and 54 that are joined, respectively, to ohmic contacts 40, 42 and 44 and are preferably formed at the same time as the ohmic contacts although insulated from the underlying semiconductive material by reason of the insulating layer 36 that is not illustrated in FIG. 5.

Figure 7:
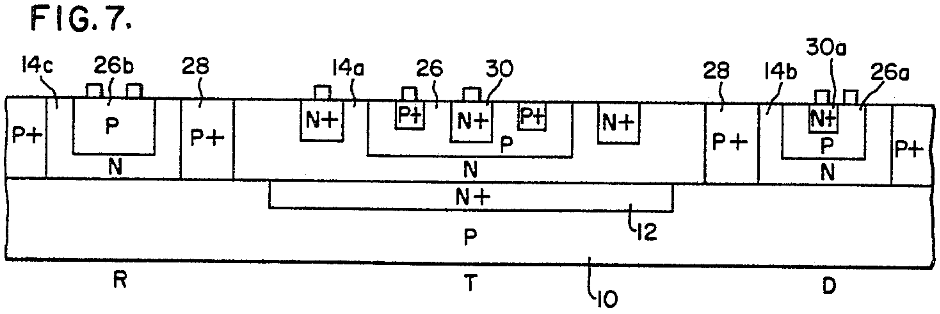
FIG. 7 is a partial sectional view of a semiconductor integrated circuit in accordance with this invention including resistor and diode elements as well as a bidirectional transistor element.

There has been described an integrated transistor structure having good bidirectional characteristics formed by design techniques that also permit formation of other elements in an integrated circuit. FIG. 7, for example, illustrates an integrated circuit portion including in the central part a transistor T in accordane with this invention while in the right-hand portion, within isolated portion **14*b* of the epitaxial layer, a diode D is provided by regions 26*a* and 30a that are like regions 26 and 30, respectively, in junction depth and impurity concentration gradient. In the left-hand portion is a resistance R provided by region 26*b* in portion 14*c* of the epitaxial layer. Regions 26*a* and 26*b* may be formed identically with region 26 while region 30*a* may be formed identically with region 30**. Suitable contacts are disposed on the diode and resistance elements as in prior practice.

Figure 8:
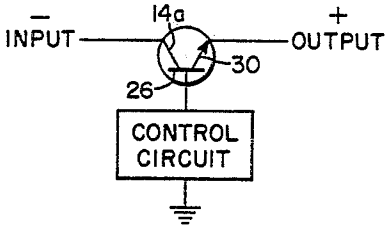
FIG. 8 is a circuit schematic of a bidirectional transistor in accordance with this invention with an example of its manner of operation in the inverted mode.

FIG. 8 illustrates in schematic form the basic type of circuit wherein the qualities of a good bidirectional transistor are desired. For further description of an example of such a circuit reference should be made to an article by Hung appearing in Semiconductor Products and Solid State Technology, July 1966, pages 15 to 17. In this type of circuit the transistor is connected so that during its operation the input and output polarities are such that the region 14*a*, nominally the collector, is forward biased with respect to the base 26 and the region 30, nominally the emitter, is reverse biased with respect to the base. The control circuit provides signals that selectively turn the transistor on or off. In the on condition it is desirable that the transistor exhibit a very low offset voltage which is made possible by the inverse mode of operation. In the off condition it is desirable that the transistor act as an open circuit between input and output and be able to withstand relatively large reverse voltages, that is with the junction between regions 26 and 30 reverse biased.

The general requirements for a bidirectional transistor are good forward and reverse current gain, low saturation resistance, low offset voltage, and high forward and reverse breakdown voltage.

In general emitter-base junctions of integrated transistors have low reverse breakdown voltages of only about 7 volts. This is also the case with the structure described in the above referred to article. In accordance with this invention, transistors have been made as described hereinbefore exhibiting forward gain (beta) of 65, inverse beta of 6, breakdown voltage in the forward direction, i.e. with the polarities opposite that shown in FIG. 8 and base open, of 30 volts from collector to emitter and reverse breakdown voltage of 24 volts from emitter to collector, with polarities as shown in FIG. 8 and the base open, which are values comparable to those achieved by discrete bidirectional transistors.

Figure 9:
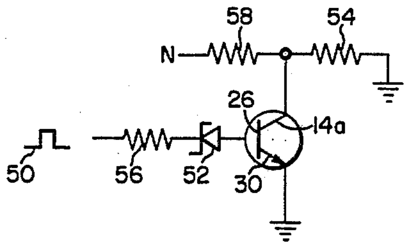
FIG. 9 is a circuit schematic of another manner in which transistors in accordance with this invention may be employed.

FIG. 9 illustrates another example of a circuit advantageously employing a bidirectional transistor structure in accordance with this invention. By application of a positive pulse at terminal 50 of high enough amplitude to breakdown Zener diode 52 and forward bias the junction between regions 30 and 26, the transistor is turned on. When the transistor is on, the AC signal is shunted to ground. Because of the good bidirectional characteristics of the transistor, the AC may swing between relatively large positive and negative values, (e.g. ±14 v.). The load, such as a summing amplifier, is represented by resistor 54. Resistors 56 and 58 provide current limiting functions.

The good reverse breakdown voltage is aided by the use of the P+ ring 34 in the base region although the exact mechanism by which the improvement results is not thoroughly understood. Since the reverse breakdown voltage is normally equal to approximately the reverse breakdown voltage of the emitter-base junction plus the forward diode drop of the collector-base junction it would be expected that the reverse collector to emitter breakdown voltage would always exceed the emitter to base breakdown voltage. Instances have been observed however when the collector to emitter breakdown voltage was, in the absence of the p+ ring 34, only about 6 volts while the emitter-base breakdown voltage for the same device was in excess of about 12 volts. It is not fully understood what surface phenomenon may be involved since an inversion layer on the surface of the base region 26 would expectably deteriorate the emitter-base reverse breakdown voltage as well as the collector-emitter breakdown voltage. In any event the use of the p+ ring 34 has been found to insure high values of collector to emitter reverse breakdown voltage.

An additional advantage achieved in transistor structures in accordance with this invention is that the current gain, forward or reverse, is less dependent on temperature variations. This may be accounted for by reason of the fact that the ratio of the resistivity of the emitter region to the resistivity of the base region is closer to unity than in previous structures. This ratio changes relatively less with temperature than in prior structures so that relatively uniform gain is preserved.

Integrated circuits employing the structure in accordance with this invention have been used with considerable success. It may be noted however that an incidental disadvantage that is tolerable in many applications is that such structures have more limited frequency response than usual integrated transistors primarily due to the larger junction capacitances. Additionally, deeper diffused base regions, and correspondingly formed resistance regions, result in the resistors having a somewhat increased temperature coefficient of resistance change which also does not detract from the utility of the device in many applications.

While the present invention has been shown and described in a few forms only it will be apparent that numerous variations may be made without departing from the true scope of the invention.

I claim as my invention:

1. A semiconductor integrated circuit structure including a transistor having good bidirectional characteristics comprising: a substrate of semiconductive material of a first conductivity type, a floating collector region of a second conductivity type disposed on a portion of a surface of said substrate; a layer of semiconductive material of said second conductivity type over said surface including said region; a base region of said first conductivity type in a surface of said layer remote from said substrate and terminating within said layer greater than half the distance from said layer surface to said substrate; an isolation wall of said first conductivity type in said surface of said layer enclosing a portion of said layer enclosing said base region and defining a collector region within said layer; an emitter region of said second conductivity type within said base region.

2. The subject matter of claim 1 further comprising: a base contact region of said first conductivity type in said base region in a configuration enclosing said emitter region, said base contact region terminating within said base region and being of lower resistivity than the remainder of said base region.

3. The subject matter of claim 2 further comprising: a collector contact region in said collector region having lower resistivity than said collector region and a configuration enclosing said base region; and individual ohmic contacts disposed on said emitter region, said base contact region, and said collector contact region.

4. The subject matter of claim 3 wherein: said structure is connected in an operating circuit that imposes a forward bias across the junction between said collector and base regions and a reverse bias across the junction between said emitter and base regions; and a control circuit is connected to said base region selectively to switch said transistor between conducting and nonconducting conditions.

5. The subject matter of claim 1 wherein: said layer has a thickness of at least about 12 microns and a resistivity of at least about one ohm-centimeter and said base region, apart from said base contact region, has a sheet resistivity of at least about 100 ohms per square.

6. The subject matter of claim 5 wherein: said layer has a thickness in the range of from about 14 microns to about 18 microns and a resistivity in the range of from about 1.5 ohm-centimeters to about 2.5 ohm-centimeters; said base region, apart from said base contact region, has a sheet resistivity in the range of from about 160 ohms per square to about 220 ohms per square and a depth within the range of from about 9 microns to about 11 microns; and said emitter region extends to within about 3 micron of the depth of said base region.

7. The subject matter of claim 1 wherein: said layer has an additional portion isolated by said isolation wall from said collector region in which is disposed a first additional region like said base region in conductivity type, resistivity and depth.

8. The subject matter of claim 7 wherein: a second additional region like said emitter region in conductivity type, resistivity, and depth is disposed within said first additional region.

References Cited

UNITED STATES PATENTS

| | | | |
|---|---|---|---|
| 2,877,359 | 3/1959 | Ross | 317—235 |
| 3,260,902 | 7/1966 | Porter | 317—235 |
| 3,293,087 | 12/1966 | Porter | 317—235 |
| 3,328,651 | 6/1967 | Miller | 317—235 |
| 3,333,166 | 7/1967 | Hochman | 317—235 |
| 3,335,341 | 8/1967 | Lin | 317—235 |
| 3,380,153 | 4/1968 | Husher | 317—235 |

JAMES D. KALLAM, Primary Examiner

U.S. Cl. X.R.

317—234